(12) United States Patent
Kubota et al.

(10) Patent No.: US 6,790,596 B2
(45) Date of Patent: Sep. 14, 2004

(54) PHOTOREACTIVE RESIN COMPOSITION AND METHOD OF MANUFACTURING CIRCUIT BOARD AND CERAMIC MULTILAYER SUBSTRATE USING THE RESIN COMPOSITION

(75) Inventors: Masahiro Kubota, Otsu (JP); Michiaki Iha, Otsu (JP); Shizuharu Waatanabe, Omihachiman (JP)

(73) Assignee: Murata Manufacturing Co., Ltd

( * ) Notice: Subject to any disclaimer, the term of this patent is extended or adjusted under 35 U.S.C. 154(b) by 77 days.

(21) Appl. No.: 10/268,900

(22) Filed: Oct. 11, 2002

(65) Prior Publication Data

US 2003/0143486 A1 Jul. 31, 2003

(30) Foreign Application Priority Data

| Jan. 25, 2002 | (JP) | 2002-017482 |
| Mar. 13, 2002 | (JP) | 2002-068508 |
| Mar. 22, 2002 | (JP) | 2002-081422 |

(51) Int. Cl.$^7$ ............... G03C 1/725; G03C 1/73; G03F 7/028; G03F 7/032; G03F 7/033
(52) U.S. Cl. ............... 430/281.1; 430/285.1; 430/286.1; 430/287.1; 430/905; 430/910; 430/916; 522/81; 522/83; 522/109
(58) Field of Search ............ 430/281.1, 285.1, 430/286.1, 287.1, 905, 910, 916; 522/81, 83, 109

(56) References Cited

U.S. PATENT DOCUMENTS

2002/0106577 A1 * 8/2002 Kubota ............... 430/252

FOREIGN PATENT DOCUMENTS

| EP | 0 414 168 | 8/1990 |
| EP | 0 809 150 A1 * | 11/1997 |
| JP | 01-296534 | 11/1989 |
| JP | 5-206600 | 8/1993 |
| JP | 10-097071 | 4/1998 |
| JP | 2000-204130 | 7/2000 |
| JP | 2002-169273 * | 6/2002 |
| WO | WO 94/15344 | 7/1994 |

OTHER PUBLICATIONS

Takahashi et al, Derwent English Abstract 2000–674831— English abstract for JP 2000–204130 (Jul. 2000).*

Takahashi et al, Machine–assisted, partial English translation for JP 2000–204130 (Jul. 2000) provided by Japan Patent Office.*

Kubota, Machine–assisted, English translation for JP 2002–169273 (Jun. 2002) provided by Japan Patent Office.*

European Patent Office Search Report dated Jan. 24, 2003.

* cited by examiner

*Primary Examiner*—Mark F. Huff
*Assistant Examiner*—Sin J. Lee
(74) *Attorney, Agent, or Firm*—Dickstein, Shapiro, Morin & Oshinsky, LLP.

(57) ABSTRACT

A photoreactive resin composition having high sensitivity and causing less gelation, and methods of manufacturing a circuit board and a ceramic multilayer substrate having a high-resolution wiring pattern and via holes by a photolithography process using the photoreactive resin composition are described. The photoreactive resin composition contains an inorganic powder containing a polyvalent metal powder and/or a polyvalent metal oxide powder, an alkali-soluble first polymer having an ethylenically unsaturated double bond, a monomer having an ethylenically unsaturated double bond, a photoreaction initiator, an organic solvent, and a second polymer having a pyrrolidone ring in a side chain.

14 Claims, 4 Drawing Sheets

PHOTOREACTIVE RESIN COMPOSITION AND METHOD OF MANUFACTURING CIRCUIT BOARD AND CERAMIC MULTILAYER SUBSTRATE USING THE RESIN COMPOSITION

BACKGROUND OF THE INVENTION

1. Field of the Invention

The present invention relates to a photoreactive resin composition used for forming various patterns on a surface of a substrate or inside the substrate, and to methods of manufacturing a circuit board and a ceramic multilayer substrate using the photoreactive resin composition.

2. Description of the Related Art

In recent years, radio-frequency electronic parts used for mobile communication equipment, satellite receivers, computers, and the like have been strongly required to have a small size and high performance. Also, wiring patterns of radio-frequency electronic parts have been required to comply with a higher density and higher-speed signals. In order to achieve a higher density and higher-speed signals, it is necessary to make wiring patterns fine and thick and make via holes fine.

In a radio-frequency electronic part, wiring patterns and via holes are conventionally formed by a screen printing process. Namely, a wiring pattern is formed by printing, through a predetermined screen mask, conductor paste formed by mixing a conductive metal powder and an organic vehicle comprising an organic binder and an organic solvent, and then baking the coated paste. A via hole is formed by printing, through a predetermined screen mask, insulator paste formed by mixing an insulating inorganic powder such as glass or the like and an organic vehicle, filling a hole formed for a via hole with conductor paste, and then baking the paste.

However, the above-described screen printing process has a problem in which refining of wiring patterns and via holes cannot be sufficiently achieved due to blurring and thinning. Particularly, in forming a wiring pattern by the screen printing process, the edge of the pattern is made thinner than the central portion of the pattern due to sagging during leveling. At a radio frequency, the so-called edge effect of concentrating a current at the edge of the pattern is significant, and thus the thinned edge of the pattern has the problem of causing disadvantages to speeding up signals at a radio frequency.

Therefore, a photolithography process using a photoreactive resin composition is proposed in Japanese Unexamined Patent Application Publication No. 1-296534. This process comprises coating, on a substrate, a photoreactive resin composition containing an inorganic powder (a conductive metal power for forming wiring patterns, or a glass power for forming an insulating layer having via hole holes) and a photoreactive organic component comprising an alkali-soluble polymer, a monomer having an ethylenically unsaturated double bond, and a photoreaction initiator; forming a mask in contact with the coated film after drying; patterning the film by exposure and development with an alkali developer; and then burning the patterned film to form a wiring pattern in a predetermined shape or an insulating layer having via-hole holes.

This method uses the photolithography process and is thus capable of forming fine and thick wiring patterns and an insulating layer having fine via holes, as compared with the screen printing process. This method is also capable of forming a pattern having a central portion and an edge portion which have substantially the same thickness. Therefore, this method can obtain wiring patterns and via holes advantageous in increasing the density and signal speed at radio frequencies, as compared with the screen printing process.

However, the photoreactive resin composition has low exposure sensitivity, and thus has the problem of low resolution of pattern formation.

Therefore, Japanese Unexamined Patent Application Publication No. 2000-204130 proposes a method of using an ethylenically unsaturated alkali-soluble polymer. This method can increase the exposure sensitivity of a photoreactive resin composition, thereby obtaining a high-resolution pattern.

However, when an inorganic powder containing a polyvalent metal power of copper or the like or a polyvalent metal oxide powder of boron oxide or the like is used for a photoreactive resin composition comprising an alkali-soluble polymer containing an ethylenically unsaturated double bond, the problem of gelling the photoreactive resin composition occurs.

As a means for preventing gelation of the photoreactive resin composition, Japanese Unexamined Patent Application Publication No. 3-205462 discloses that benzotriazole or the like is added as a stabilizer. This means cannot sufficiently prevent gelation for the following reason.

The photoreactive resin composition basically has the property of being readily gelled due to the reaction of acid functional groups (carboxyl groups and the like) in the alkali-soluble polymer with a polyvalent metal hydroxide on the surfaces of the inorganic powder containing the polyvalent metal power or polyvalent metal oxide powder. However, the stabilizer such as benzotriazole can slow down the reaction of the acid functional groups with the polyvalent metal hydroxide. When the ethylenically unsaturated double bond is added to the alkali-soluble polymer in order to improve the sensitivity of the photoreactive resin composition, the ethylenically unsaturated double bond acts on the polyvalent metal hydroxide to accelerate the reaction of the acid functional groups in the alkali-soluble polymer with the polyvalent metal hydroxide. Thus, the stabilizer cannot slow down the reaction of the acid function groups in the alkali-soluble polymer with the polyvalent metal hydroxide, thereby failing to prevent gelation.

Gelation of the photoreactive resin composition causes difficulty in coating and destabilizes the development process even if coating is possible.

SUMMARY OF THE INVENTION

Accordingly, it is an object of the present invention to provide a photoreactive resin composition having high exposure sensitivity and causing no gelation. Another object of the present invention is to provide methods of manufacturing a circuit board and a ceramic multilayer substrate each having wiring patterns and via holes formed by the photolithography process using the photoreactive resin composition.

As a result of intensive research for solving the above problem, the inventors found that by adding a predetermined amount of polymer having a pyrrolidone ring in a side chain to a photoreactive resin composition comprising an alkali-soluble polymer having an ethylenically unsaturated double bond, gelation of the photoreactive resin composition can be effectively prevented while maintaining high sensitivity.

Namely, the present invention relates to a photoreactive resin composition comprising (a) an inorganic powder containing a polyvalent metal powder and/or a polyvalent metal oxide powder, (b) an alkali-soluble first polymer having an ethylenically unsaturated double bond, (c) a monomer having an ethylenically unsaturated double bond, (d) a photoreaction initiator, (e) an organic solvent, and (f) a second polymer having a pyrrolidone ring in a side chain.

Particularly, the photoreactive resin composition of the present invention contains the second polymer having a pyrrolidone ring in a side chain, and the reaction of the acid functional groups in the alkali-soluble first polymer with the polyvalent metal hydroxide on the surfaces of the inorganic powder containing the polyvalent metal powder and/or the polyvalent metal oxide powder can be significantly slowed down even when the first polymer has the ethylenically unsaturated double bond, thereby preventing gelation of the photoreactive resin composition.

This is because a micro gel produced by the reaction of the second polymer having a pyrrolidone ring in a side chain with the polyvalent metal hydroxide causes steric hindrance to inhibit the action of the ethylenically unsaturated double bond in the alkali-soluble first polymer on the polyvalent metal hydroxide, significantly slowing down the reaction of the acid functional groups of the first polymer with the polyvalent metal hydroxide.

In the photoreactive resin composition of the present invention, the polyvalent metal powder contained in the inorganic powder can be a copper powder, and the copper powder is preferably coated with a copper oxide. In this case, the oxygen content of the copper powder is preferably 0.4% by weight to 1.2% by weight.

In the photoreactive resin composition of the present invention, the second polymer is preferably a copolymer of vinylpyrrolidone and a monomer having an ethylenically unsaturated double bond. Alternatively, the second polymer may be a homopolymer. In this case, the second polymer is preferably polyvinylpyrrolidone.

In the photoreactive resin composition of the present invention, the Fikentscher viscosity characteristic value of the second polymer is preferably 15 to 60.

In the photoreactive resin composition of the present invention, the content of the second polymer is preferably 0.1 part by weight to 5 parts by weight based on 100 parts by weight of the polyvalent metal powder contained in the inorganic powder or 0.01 part by weight to 1 part by weight based on 100 parts by weight of the polyvalent metal oxide powder contained in the inorganic powder.

In the photoreactive resin composition of the present invention, the organic solvent preferably contains a diol compound having two hydroxyl groups per molecule.

The content of the organic solvent is preferably 10 times by weight to 50 times by weight larger than the second polymer.

The photoreactive resin composition of the present invention preferably further contains a polyhydric alcohol having four or more hydroxyl groups per molecule.

The present invention also provides a method of manufacturing a circuit board comprising the steps of coating the photoreactive resin composition of the present invention on a substrate, exposing and developing the photoreactive resin composition to form a predetermined pattern on the substrate, and baking the pattern.

The present invention also provides a method of manufacturing a circuit board comprising the steps of coating the photoreactive resin composition of the present invention on a supporting member, exposing and developing the photoreactive resin composition to form a predetermined pattern on the supporting member, transferring the pattern formed on the supporting member to a substrate, and baking the pattern.

Furthermore, the present invention provides a method of manufacturing a ceramic multilayer substrate comprising the steps of coating the photoreactive resin composition of the present invention on a ceramic green sheet, exposing and developing the photoreactive resin composition to form a predetermined pattern on the ceramic green sheet, laminating a plurality of the green sheets each having the pattern formed thereon to form a laminate, and baking the laminate.

Furthermore, the present invention provides a method of manufacturing a ceramic multilayer substrate comprising the steps of coating the photoreactive resin composition of the present invention on a supporting member, exposing and developing the photoreactive resin composition to form a predetermined pattern on the supporting member, transferring the pattern formed on the supporting member to a ceramic green sheet, laminating a plurality of the ceramic green sheets each having the pattern formed thereon to form a laminate, and baking the laminate.

DESCRIPTION OF THE PREFERRED EMBODIMENTS

Figure 1A:
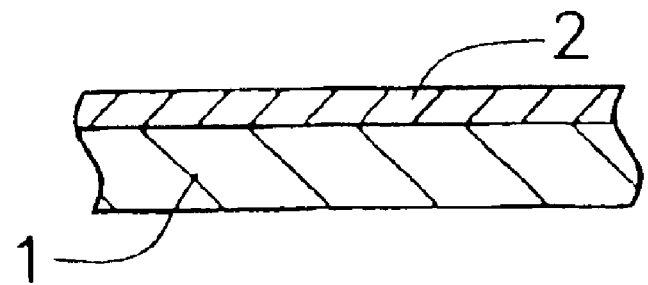
FIGS. 1A to 1E are schematic sectional views showing an example of a pattern forming method using a photoreactive resin composition according to the present invention.

A photoreactive resin composition of the present invention will be described in further detail below.

The photoreactive resin composition of the present invention contains the following components:
  (a) an inorganic powder containing a polyvalent metal powder and/or a polyvalent metal oxide powder;
  (b) an alkali-soluble first polymer having an ethylenically unsaturated double bond;
  (c) a monomer having an ethylenically unsaturated double bond;
  (d) a photoreaction initiator;
  (e) an organic solvent; and
  (f) a second polymer having a pyrrolidone ring in a side chain.

The photoreactive resin composition may further contain the following components:
  (g) a polyhydric alcohol having four or more hydroxyl groups per molecule;
  (h) an ultraviolet absorber;
  (i) a thixotropic agent; and
  (j) a plasticizer.

The photoreactive resin composition may further contain an antifoaming agent, a dispersant, a surfactant, a polymerization inhibitor, a release agent, a stabilizer, and the like.

Each of the components will be described in detail below.
  (a) Inorganic Powder
  The inorganic powder used in the present invention contains a polyvalent metal powder and/or a polyvalent metal oxide powder. The polyvalent metal represents a metal having a valence of 2 or more when being ionized.

$A_1$: Polyvalent Metal Powder

For example, when a conductor pattern such as a wiring pattern of a ceramic multilayer substrate, an electrode pattern of a ceramic electronic part or the like, is formed by using the photoreactive resin composition of the present invention, the polyvalent metal powder is used as the inorganic powder. In forming such a conductor pattern, a conductive metal powder of silver, platinum, aluminum or the like, may be added to the polyvalent metal powder. Also, the polyvalent metal oxide powder described below may be added to the polyvalent metal powder in order to improve adhesion between the conductor pattern and the substrate after burning.

The polyvalent metal powder preferably comprises spherical particles, and has an average particle diameter $D_{50}$ of 1 μm to 5 μm and a specific surface area of 0.1 to 2.0 m$^2$/g. With the average particle diameter and the specific surface area out of the above ranges, it becomes difficult to form a pattern in some cases.

As the polyvalent metal powder, copper, nickel, palladium, molybdenum, tungsten and the like, can be used. Particularly, copper has the strong function to cause gelation of the photoreactive resin composition. However, the present invention can prevent gelation of the photoreactive resin composition even when a copper powder having the strong gelation property is used. Therefore, the present invention is capable of forming a conductor pattern having high conductivity at low cost.

Also, the problem of the copper powder can be overcome by coating the surfaces of the copper powder with copper oxide. Namely, using the copper powder with the surfaces coated with a copper oxide can effectively prevent gelation of the photoreactive resin composition.

Methods of coating the surfaces of the copper powder with copper oxide include heating the copper powder at room temperature or higher in an oxygen-containing atmosphere. This method can easily control the state of the copper oxide on the surfaces of the copper powder to form a dense film of the copper oxide.

In coating the surfaces of the copper powder with the copper oxide, the oxygen content of the copper powder is preferably 0.4% by weight to 1.2% by weight. With an oxygen content of less than 0.4% by weight, the surfaces of the copper powder cannot be sufficiently coated with the copper oxide and fails to obtain the sufficient effect of preventing gelation. On the other hand, with an oxygen content of over 1.2% by weight, the copper oxide becomes brittle and fails to obtain a sufficient effect of preventing gelation. The oxygen content is more preferably 0.6% by weight to 1.0% by weight.

$A_2$: Polyvalent Metal Oxide Powder

When a ceramic substrate or ceramic green sheet having a via hole is formed by using the photoreactive resin composition of the present invention, a polyvalent metal oxide powder is used as the inorganic powder. As the polyvalent metal oxide powder, a glass powder, a ceramic powder and the like, can be used.

Examples of the glass powder include powders of $SiO_2$—PbO system, $SiO_2$—ZnO system, $SiO_2$—$Bi_2O_3$ system, $SiO_2$—$K_2O$ system, $SiO_2$—$Na_2O$ system, $SiO_2$—PbO—$B_2O_3$ system, $SiO_2$—ZnO—$B_2O_3$ system, $SiO_2$—$Bi_2O_3$—$B_2O_3$ system, $SiO_2$—$K_2O$—$B_2O_3$ system, and $SiO_2$—$Na_2O$—$B_2O_3$ system glass, and the like.

As the ceramic powder, known ceramic powders such as crystallized glass system, glass composite system, and non-glass system powders can be used. Examples of such ceramic powders include oxide powders of at least one polyvalent metal selected from Al, Ba, Ti, Sr, Pb, Zr, Mn, Co, Ni, Fe, Y, Nb, La and Ru.

The polyvalent metal oxide powder preferably comprises spherical particles, and has an average particle diameter $D_{50}$ of 0.1 μm to 5.0 μm and a specific surface area of 1.0 to 10.0 m$^2$/g. With the average particle diameter and the specific surface area out of the above ranges, it becomes difficult to form via holes in some cases.

(b) First Polymer

The first polymer used in the photoreactive resin composition of the present invention is an alkali-soluble binder polymer having an ethylenically unsaturated double bond.

As the first polymer, various resins such as cellulose resins, acrylic resins, and the like can be used. Particularly, the first polymer preferably comprises an acrylic copolymer having a carboxyl group in a side chain. Using such a polymer can facilitate development of the photoreactive resin composition with an alkali or aqueous developer.

The polymer comprising an acrylic copolymer having a carboxyl group in a side chain can be produced by, for example, copolymerization of an unsaturated carboxylic acid and an ethylenically unsaturated compound. Examples of the unsaturated carboxylic acid include acrylic acid, methacrylic acid, maleic acid, fumaric acid, vinylacetic acid, and the like. The anhydrides thereof can also be used. Examples of the ethylenically unsaturated compound include acrylic esters such as methyl acrylate, ethyl acrylate and the like; methacrylic esters such as methyl methacrylate, ethyl methacrylate and the like; and fumaric esters such as monoethyl fumarate and the like.

The following methods can be used as the method of adding the ethylenically unsaturated double bond to the acrylic copolymer having a carboxyl group in a side chain.

The method of adding an acrylic monomer having a functional group, for example, an epoxy group or the like, which is reactable with the carboxyl group in a side chain of the acrylic copolymer.

The method of reacting an unsaturated monocarboxylic acid with an acrylic copolymer into which an epoxy group is introduced instead of the carboxyl group in a side chain, and further introducing a saturated or unsaturated polyvalent carboxylic anhydride.

The acrylic copolymer having a carboxylic group in a side chain preferably has a weight average molecular weight (Mw) of 50000 or less, and an acid value of 50 to 150. Beyond these ranges, it becomes difficult to form a pattern.

(c) Monomer Having an Ethylenically Unsaturated Double Bond

The monomer used in the photoreactive resin composition of the present invention is a photocuring monomer having an ethylenically unsaturated double bond.

Examples of the monomer include hexanediol triacrylate, tripropylene glycol triacrylate, trimethylolpropane triacryalte, stearyl acrylate, tetrahydrofurfuryl acrylate, lauryl acrylate, 2-phenoxyethyl acrylate, isodecyl acrylate, isooctyl acrylate, tridecyl acrylate, caprolactone acrylate, ethoxylated nonylphenol acrylate, 1,3-butanediol diacrylate, 1,4-butanediol diacrylate, diethylene glycol diacrylate, tetraethyelne glycol diacrylate, triethylene glycol diacrylate, ethoxylated bisphenol A diacrylate, propoxylated neopentyl glycol diacrylate, tris(2-hydroxyethyl) isocyanurate triacrylate, ethoxylated trimethylolpropane triacrylate, pentaerythritol triacrylate, propoxylated trimethylolpropane triacrylate, propoxylated glyceryl triacrylate, pentaerythritol tetraacrylate, ditrimethylolpropane tetraacrylate, dipentaerythritol hydroxypentaacrylate, ethoxylated pentaerythritol tetraacrylate, tetrahydrofurfuryl methacrylate, cyclohexyl methacrylate, isodecyl methacrylate, lauryl methacrylate, triethylene glycol dimethacrylate, ethylene glycol dimethacrylate, tetraethylene glycol dimethacrylate, 1,4-butanediol dimethacrylate, diethylene glycol dimethacrylate, 1,6-hexanediol dimethacrylate, neopentyl glycol dimethacrylate, 1,3-butylene glycol dimethacrylate, ethoxyated bisphenol A dimethacrylate, trimethylolpropane trimethacrylate, and the like.

(d) Photoreaction Initiator

Examples of the photoreaction initiator used in the photoreactive resin composition of the present invention include benzoin, benzoin ethyl ether, benzoin isobutyl ether, benzoin isopropyl ether, benzophenone, benzoylbenzoic acid, methyl benzoylbenzoate, 4-benzoyl-4'-methyldiphenyl sulfide, benzyldimethylketal, 2-n-butoxy-4-dimethyl aminobenzoate, 2-chlorothioxanthone, 2,4-diethylthioxanthone, 2,4-diisopropylthioxanthone, isopropylthioxanthone, 2-dimethylaminoethyl benzoate, ethyl p-dimethylaminobenzoate, isoamyl p-dimethylaminobenzoate, 3,3'-dimethyl-4-methoxybenzophenone, 2,4-dimethylthioxanthone, 1-(4-dodecylphenyl)-2-hydroxy-2-methylpropane-1-one, 2,2'-dimethoxy-1,2-diphenylethane-1-one, hydroxycyclohexyl phenyl ketone, 2-hydroxy-2-methyl-1-phenylpropane-1-one, 1-[4-(2-hydroxyethoxy)-phenyl]-2-hydroxy-2-methyl-1-propane-1-one, 2-methyl-1-[4-(methylthio)phenyl]-2-morpholinopropane-1-one, methylbenzoyl formate, 1-phenyl-1,2-propanedione-2-(o-ethoxycarbonyl)oxime, 2-benzyl-2-dimethylamino-1-(4-morpholinophenyl)-1-butanone, bis(2,6-dimethoxybenzoyl)-2,4,4-trimethylpentylphosphine oxide, bis(2,4,6-trimethylbenzoyl)phenylphosphine oxide, and the like.

(e) Organic Solvent

As the organic solvent used for the photoreactive resin composition of the present invention, alcohols such as dipropylene glycol monomethyl ether and the like, and alcohol acetates such as ethylcarbitol acetate and the like can be used.

The boiling point of the organic solvent is preferably 170° C. to 300° C. With a boiling point of less than 170° C., the organic solvent evaporates during coating of the photoreactive resin composition on the substrate to change the viscosity of the photoreactive resin composition in some cases. With a boiling point of over 300° C., the organic solvent less evaporates during drying of the photoreactive resin composition.

The organic solvent preferably contains a diol compound having two hydroxyl groups per molecule. Therefore, the diol compound can prevent growth of micro gel produced by the reaction of the second polymer with the polyvalent metal hydroxide, and further prevent gelation of the photoreactive resin composition.

Examples of the diol compound include ethylene glycol, propylene glycol, trimethylene glycol, butylene glycol, tetramethylene glycol, pentamethylene glycol, butenediol, hexamethylene glycol, heptanediol, octanediol, nonanediol, decanediol, diethylene glycol, dipropylene glycol, triethylene glycol, tripropylene glycol and the like.

The content of the organic solvent is preferably 10 times by weight to 50 times by weight larger than the second polymer. With a solvent content of less than 10 times by weight, the micro gel produced by the reaction of the second polymer with the polyvalent metal hydroxide significantly increases in size, and thus the photoreactive resin composition is gelled in some cases. On the other hand, with a solvent content of over 50 times by weight, the viscosity of the photoreactive resin composition significantly decreases to fail to uniformly coat the photoreactive resin composition on the substrate in some cases.

(f) Second Polymer

The second polymer used in the present invention has a pyrrolidone ring in a side chain. Examples of such a polymer include a copolymer of a monomer having a pyrrolidone ring in a side chain and a monomer having an ethylenically unsaturated double bond, and the like.

As the monomer having a pyrrolidone ring in a side chain, vinylpyrrolidone, allylpyrrolidone, butenylpyrrolidone and the like can be used. Of these monomers, vinylpyrrolidone has a short functional group bound to the pyrrolidone ring, and thus the second polymer contains the pyrrolidone ring at a high relative density. Therefore, using vinylpyrrolidone as the monomer having a pyrrolidone ring in a side chain can effectively prevent gelation of the photoreactive resin composition.

As the monomer having an ethylenically unsaturated double bond, the same monomers as described above for the first polymer can be used. However, for the second polymer, the monomer having an ethylenically unsaturated double bond preferably has no acid functional group. Examples of the acid functional group include a carboxyl group, a hydroxyl group, a sulfonic acid group, an acryl group and the like. By using the monomer having such an acid functional group, the micro gel produced by the reaction of the second polymer with the polyvalent metal hydroxide excessively increases in size to cause gelation of the photoreactive resin composition in some cases.

When vinylpyrrolidone is selected as both the monomer having a pyrrolidone ring in a side chain and the monomer having the ethylenically unsaturated double bond, the second polymer is the homopolymer polyvinylpyrrolidone. In using polyvinylpyrrolidone as the second polymer, the relative density of the pyrrolidone ring contained in the second polymer is increased to facilitate the reaction of the second polymer with the polyvalent metal hydroxide, whereby gelation of the photoreactive resin composition can be effectively prevented.

When vinylpyrrolidone is not selected as the monomer having the ethylenically unsaturated double bond in the second polymer, the ratio of the monomer having the ethylenically unsaturated double bond in the second polymer is preferably 90 mol % or less. With a monomer ratio of over 90 mol %, the reaction of the second polymer with the polyvalent metal hydroxide slightly proceeds to cause gelation of the photoreactive resin composition in some cases.

The Fikentscher viscosity characteristic value of the second polymer is preferably 15 to 60. The the Fikentscher viscosity characteristic value (abbreviated to an "F characteristic value" hereinafter) is determined by the equation $$F=(1.5 \log \eta_{rel}-1)/(0.15+0.003c)+(300c \cdot \log \eta_{rel}+(c+1.5c \cdot \log \eta_{rel})^2)^{1/2}/(0.15c+0.003c^2)$$

In the equation, $\eta_{rel}$ represents the relative viscosity of an aqueous solution of the second polymer to water, which is measured by a capillary viscometer at 25° C., and c represents the concentration (%) of the second polymer in the aqueous solution of the second polymer.

With an F characteristic value of less than 15, the micro gel produced by the reaction of the second polymer with the polyvalent metal hydroxide decreases in size to weaken the function of preventing the reaction of the acid functional group of the first polymer with the polyvalent metal hydroxide, thereby causing gelation of the photoreactive resin composition. On the other hand, with an F characteristic value of over 60, the micro gel excessively increases in size to cause gelation of the photoreactive resin composition.

The content of the second polymer is preferably 0.1 part by weight to 5 parts by weight based on 100 parts by weight of the polyvalent metal powder contained in the inorganic powder. With a content of less than 0.1 part by weight, the micro gel produced by the reaction of the second polymer with the polyvalent metal hydroxide decreases in amount to cause gelation of the photoreactive resin composition in some cases. On the other hand, with a content of over 5 part by weight, the micro gel increases in amount to cause gelation of the photoreactive resin composition in some cases.

Also, the content of the second polymer is preferably 0.01 part by weight to 1 part by weight based on 100 parts by weight of the polyvalent metal oxide powder contained in the inorganic powder. With a content of less than 0.01 part by weight, the micro gel produced by the reaction of the second polymer with the polyvalent metal hydroxide decreases in amount to cause gelation of the photoreactive resin composition in some cases. On the other hand, with a content of over 1 part by weight, the micro gel increases in amount to cause gelation of the photoreactive resin composition in some cases.

(g) Polyhydric Alcohol

The polyhydric alcohol preferably has four or more hydroxyl groups per molecule. Adding such a polyhydric alcohol can accelerate the formation of the micro gel due to the reaction of the second polymer with the polyvalent metal hydroxide, thereby further preventing gelation of the photoreactive resin composition.

Examples of the polyhydric alcohol include threitol, erythritol, arabitol, xylitol, ribitol, adonitol, glucitol, mannitol, iditol, talitol, galactitol, allitol, perseitol, volemitol, and the like.

(h) Ultraviolet Absorber

By adding the ultraviolet absorber to the photoreactive resin composition, absorptivity of exposure light can be improved, and exposure defects due to light scattering can be suppressed. As the ultraviolet absorber, an azo red pigment, an amine red dye and the like can be used.

(i) Thixotropic Agent

An agent referred to as a "thickening antisagging antisettling agent" or "antisagging antisettling agent" or "pigment wetting dispersing antisettling agent" can be used as the thixotropic agent. As the "thickening antisagging antisettling agent", a vegetable polymerized oil system, a polyether ester-type surfactant, a hydrogenated castor oil system, a mixture of a hydrogenated castor oil system and an amide system, a fatty acid amide wax system and the like, can be used. As the "antisagging antisettling agent", a specific fatty acid system, a sulfuric ester type anionic surfactant, a polyethylene oxide system, a mixture of a polyethylene oxide system and an amide system and the like, can be used. As the "pigment wetting dispersing antisettling agent", a fatty acid-type polyvalent carboxylic acid, a polymeric polyester amine salt, a polyether ester-type anionic surfactant, a long-chain amine salt of high-molecular-weight polycarboxylic acid, a salt of long-chain polyaminoamide and polymeric acid polyester, a salt of long-chain polyaminoamide and phosphoric acid, a specific modified polyamide system, a phosphate-type surfactant, an amidoamine salt of a polymeric acid polyester and the like, can be used.

Other examples of the thixotropic agent include fine powders of hydroxyethyl cellulose, methyl cellulose, carboxymethyl cellulose, sodium alginate, casein, sodium caseinate, xanthan gum, polyether urethane-modified products, polyacrylic ester, polymethacrylic ester, montmorillonite, aluminum stearate, zinc stearate, aluminum octylate, dextrin fatty acid ester, benzylidene sorbitol, vegetable polymerized oil, surface-treated calcium carbonate, organic bentonite, silica, titania, zirconia, alumina, and the like.

(j) Plasticizer

Examples of the plasticizer include normal alkyl phthalates such as dimethyl phthalate, di-n-octyl phthalate, bis-2-ethylhexyl phthalate and the like; phthalic esters such as di-2-ethylhexyl phthalate, diisodecyl phthalate, butylbenzyl phthalate, diisononyl phthalate, ethyl phthalethyl glycolate, butyl phthalylbutyl glycolate and the like; trimellitic esters such as tri-2-ethylhexyl trimellitate, tri-n-alkyl trimellitate, triisononyl trimellitate, triisodecyli trimellitate and the like; fatty acid dibasic acid esters such as dimethyl adipate, dibutyl adipate, di-2-ethylhexyl adipate, diisodecyl adipate, dibutyl diglycol adipate, di-2-ethylhexyl azelate, dimethyl sebacate, di-2-ethylhexyl sebacate, di-2-ethylhexyl malate, acetyl-tri-(2-ethylhexyl) citrate, acetyltributyl citrate and the like; glycol derivatives such as polyethylene glycol benzoate, triethylene glycol di-(2-ethylhexoate), polyglycol ether and the like; glycerin derivatives such as glycerol triacetate, glycerol diacetyl monolaurate and the like; polyesters of sebacic acid, adipic acid, azelaic acid, phthalic acid and the like; low-molecular-weight polyethers having a molecular weight of 300 to 3000; low-molecular-weight poly-α-styrene, and low-molecular-weight polystyrene; ortho-phosphoric esters such as trimethyl phosphate, triethyl phosphate, tributyl phosphate, tri-2-ethylhexyl phosphate, tributoxyethyl phosphate, triphenyl phosphate, tricresyl phosphate, trixylenyl phosphate, cresyl diphenyl phosphate, xylenyl diphenyl phosphate, 2-ethylhexyl diphenyl phosphate and the like; recinoleic esters such as methyl acetyl recinoleate and the like; polyesters such as poly-1,3-butanediol adipate and the like; epoxy esters such as epoxidized soybean oil and the like; acetic esters such as glycerin triacetate, 2-ethylhexyl acetate and the like.

The photoreactive resin composition of the present invention may be either paste or slurry.

First Embodiment; Method of Forming Wiring Pattern

The method of forming a wiring pattern using the photoreactive resin composition of the present invention is described in detail below with reference to FIG. 1. Although an example in which the photoreactive resin composition is a negative type is described here, a positive photoreactive resin can be used by reversing light and shape of a photomask pattern.

First, as shown in FIG. 1A, the photoreactive resin composition of the present invention is coated on a supporting member 1 by a spin coater method, a screen printing method, a doctor blade method or the like, and then dried at 40 to 100° C. for 10 minutes to 2 hours to form a coated film 2 made of the photoreactive resin composition.

Figure 1B:
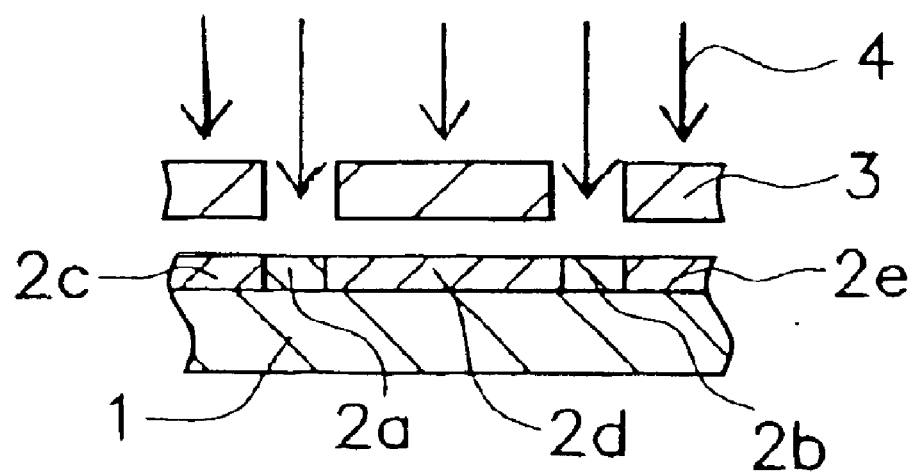

Next, as shown in FIG. 1B, the coated film 2 on the supporting member 1 is irradiated with active light rays 4 emitted from a high-pressure mercury lamp with an exposure of 20 to 5000 mJ/cm$^2$ through a mask 3 having a desired pattern formed therein to form a predetermined pattern. Consequently, the portions (exposed portions) 2a and 2b irradiated with the light rays 4 are cured to form areas which are not developed in the subsequent development process.

Figure 1C:
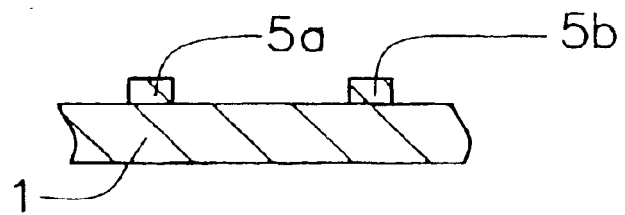

Next, the coated film comprising the exposed portions 2a and 2b and the unexposed portions 2c to 2e is treated with a general-purpose alkali aqueous solution such as a sodium carbonate aqueous solution by a spray shower or the like to dissolve (i.e., develop) the unexposed portions 2c to 2e into the alkali aqueous solution, forming wiring patterns 5a and 5b on the supporting member 1, as shown in FIG. 1C.

Figure 1D:
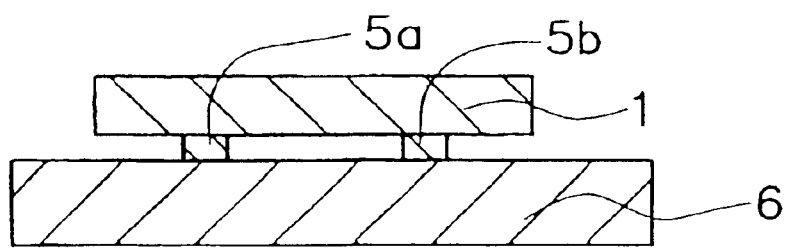

Next, as shown in FIG. 1D, the wiring patterns 5a and 5b formed on the supporting member 1 are thermally transferred onto a substrate 6 by using a general heat press device under conditions of 1 to 200 MPa and 50 to 150° C. for a time of 5 seconds to 5 minutes.

Figure 1E:
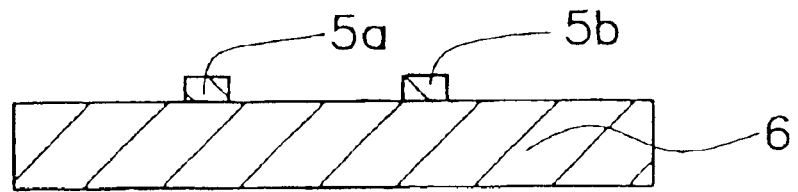

Then, the supporting member 1 is separated from the substrate 6 to form the high-definition fine wiring patterns 5a and 5b (unburned) on the substrate 6, as shown in FIG. 1E.

The unburned wiring patterns 5a and 5b are burned at a predetermined temperature. As a result, the substrate 6 having the wiring patterns 5a and 5b formed thereon by using the photoreactive resin composition of the present invention can be manufactured.

As the supporting member 1 for transfer, a film-like supporting member such as a polyester film, a polypropylene film, a nylon film or the like can be used. To achieve a low release property from the substrate 6, the surface of the supporting member 1 may be treated by known release treatment to provide a silicon coating, wax coating, melamine coating or the like.

As the substrate 6, a ceramic green sheet formed by molding a slurry mixture of a ceramic powder and an organic vehicle into a sheet can be used. The ceramic green sheet may contain a glass powder.

Alternatively, the ceramic green sheet may be a photosensitive ceramic green sheet comprising a mixture of an organic vehicle and a photosensitive organic component, and having fine via holes formed therein by the photolithography process.

More specifically, a ceramic green sheet containing an insulating ceramic powder of $Al_2O_3$ or the like, a dielectric ceramic powder of $BaTiO_3$ or the like, a ferrite powder of nickel zinc ferrite, nickel zinc copper ferrite or the like, a conductive ceramic powder of $RuO_2$, $Pb_2Ru_2O_7$, $Bi_2Ru_2O_7$, a compound oxide of Mn.Co.Ni or the like, a piezoelectric ceramic powder of PZT or the like can be appropriately used as the ceramic green sheet.

In this example, the ceramic green sheet is used as the substrate on which a pattern is formed. However, the present invention can be applied to various cases such as the formation of a pattern on an insulating ceramic layer or a dielectric ceramic layer, and the like.

Besides the pattern forming method using the supporting member 1 shown in FIG. 1, a fine pattern can be formed by coating the photoreactive resin composition of the present invention directly on the insulating substrate used as the supporting member 1 without the transfer step, and then patterning the resultant film by photolithography.

Second Embodiment; Method of Forming Via Holes and Method of Producing a Circuit Board Next, the method of forming via holes by using the photoreactive resin composition (containing an insulating inorganic powder) of the present invention is described in detail below with reference to an example using the circuit board (chip coil) shown in FIG. 2.

Figure 2:
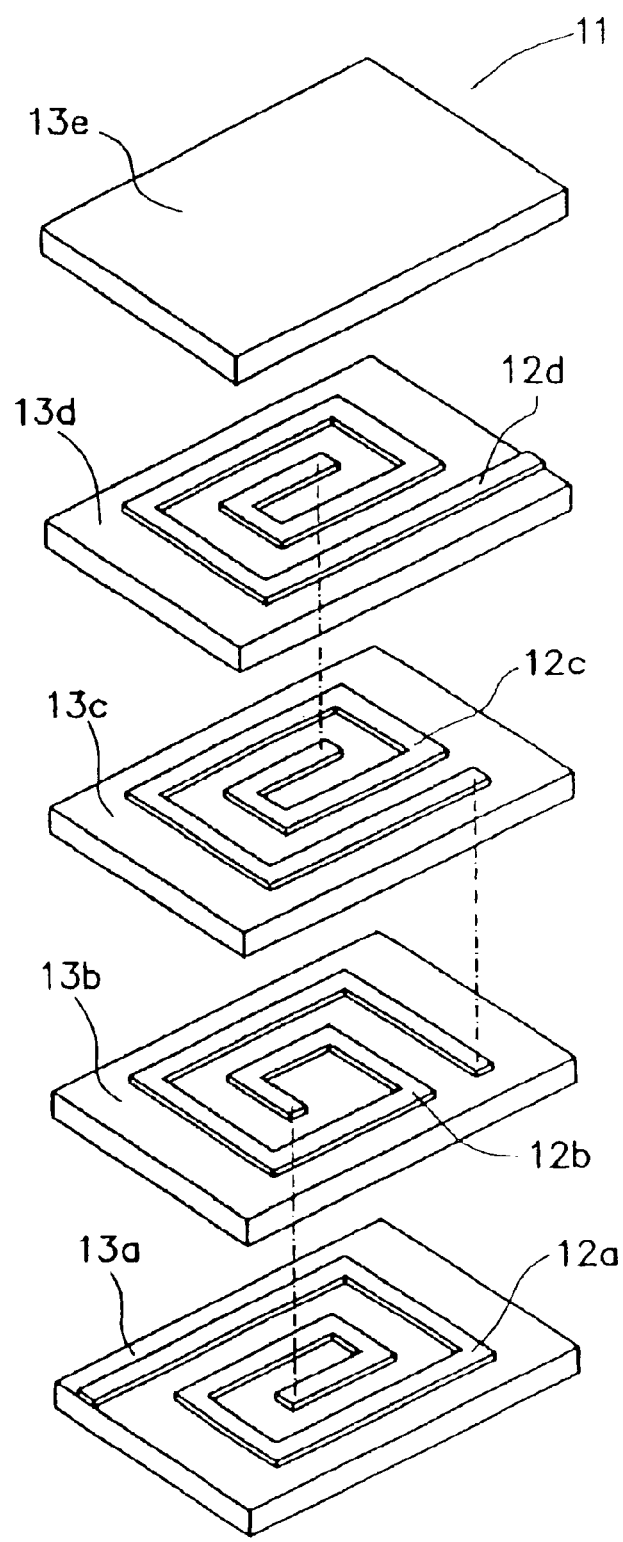
FIG. 2 is an exploded perspective view showing a circuit board (chip coil) according to the present invention.

The chip coil 11 shown in FIG. 2 comprises a laminate formed by laminating in turn insulator layers 13a to 13e made of alumina or the like and having internal electrodes 12a to 12d respectively formed therein. Although not shown in the drawing, external electrodes are provided at both ends of the chip coil 11.

In the chip coil 11, the internal electrodes 12a to 12d, which form a coil pattern, are respectively provided between the insulator layers 13a and 13b, between the insulator layers 13b and 13c, between the insulator layers 13c and 13d, and between the insulator layers 13d and 13e, and the internal electrode 12a provided between the insulator layers 13a and 13b and the internal electrode 12d provided between the insulating layers 13d and 13e are respectively connected to the external electrodes.

The internal electrode 12a provided between the insulator layers 13a and 13b is electrically connected to the internal electrode 12b provided between the insulator layers 13b and 13c through via holes (not shown in the drawing) formed in the insulating layer 13b. Similarly, the internal electrodes 12b and 12c are electrically connected to each other through via holes (not shown in the drawing) formed in the insulating layer 13c, and the internal electrodes 12c and 12d are electrically connected to each other through via holes (not shown in the drawing) formed in the insulating layer 13d.

The method of manufacturing the chip coil 11 will be described blow.

In the chip coil 11, the internal electrodes 12a to 12d are formed by the wiring pattern forming method using the photoreactive resin composition (conductive paste containing a conductive metal powder), and the via holes are formed in the insulator layers 13b to 13d by photolithography patterning with the photoreactive resin composition (insulating paste containing an insulating inorganic powder) of the present invention.

First, a desired wiring pattern is formed on the insulator layer 13a made of alumina or the like by the wiring pattern forming method of the first embodiment using the photoreactive resin composition containing a conductive metal powder as a main component of the inorganic powder. Next, after degreasing, the wiring pattern is burned, for example, at 850° C. in the air for about 1 hour to form the spiral internal electrode 12a.

Then, the insulator layer 13b having holes for via holes formed therein is formed on the insulator layer 13a on which the internal electrode 12a has been formed by means of the wiring pattern forming method of the first embodiment using the photoreactive resin composition of the present invention.

In detail, the photoreactive resin composition of the present invention is coated on the insulator layer 13a on which the internal electrode 12a has been formed, and then exposed and developed through a predetermined mask to form a resin layer containing the insulating inorganic powder and having the holes for via holes. Furthermore, the resin layer containing the insulating inorganic powder is burned at a predetermined temperature in the air to form the insulator layer 13b having the holes for via holes.

Furthermore, the holes for via holes of the insulator layer 13b are filled with conductive paste, and then dried to form the via holes for connecting an end of the internal electrode 12a to an end of the internal electrode 12b.

Then, the spiral internal electrode 12b is formed on the insulator layer 13b by the same method as the internal electrode layer 12a. Similarly, the insulator layer 13c, the internal electrode 12c, the insulator layer 13d and the internal electrode 12d are provided by the same method as described above to obtain the chip coil 11 having a structure in which the internal electrodes 12a to 12d and the insulator layers 13a to 13e are laminated.

Besides the chip coil, the circuit board of the present invention may be a substrate for circuit elements such as a chip capacitor, a chip LC filter, and the like, a substrate for modules such as a VCO (Voltage Controlled Oscillator), PLL (Phase Locked Loop) and the like.

After a fine pattern is formed on the supporting member 1 or the substrate 6 by using the photoreactive resin composition of the present invention, a mixture containing a functional organic binder may be coated to form a laminated structure, and then heat-treated by burning to manufacture a multilayer circuit board or a multilayer circuit element. As the mixture containing the functional organic binder, a mixture containing the ceramic powder and the organic binder, a mixture containing a conductive metal powder of copper, silver, or the like and the organic binder, and a mixture further containing a glass powder may be used.

Third Embodiment; Method of Manufacturing Ceramic Multilayer Substrate

The method of manufacturing a ceramic multilayer substrate of the present invention is described with reference to FIG. 3.

A ceramic multilayer substrate 21 is a multilayer circuit board comprising a laminate of insulator layers 22a to 22e and dielectric layers 23a and 23b. In the ceramic multilayer substrate 21, a capacitor pattern, a coil pattern, a stripline and the like are formed by internal layer patterns 24a to 24c and via holes 25. Furthermore, a chip part 26 such as a chip capacitor or the like, a thick film resistor 27, a semiconductor IC 28 and the like are formed on one main surface of the ceramic multilayer substrate 21. These elements are respectively connected to a surface layer pattern 29 and the internal layer patterns 24a to 24c.

Next, the method of manufacturing the ceramic multilayer substrate 21 is described.

First, a glass powder, a ceramic powder and an organic vehicle are mixed to prepare slurry for insulator ceramic green sheets. Similarly, slurry for dielectric ceramic green sheets is then prepared. Next, each of the slurries is formed into a sheet by the doctor blade method or the like, and dried at a temperature of 50 to 150° C. to prepare an insulator ceramic green sheet and a dielectric ceramic green sheet.

Then, each of the internal layer patterns 24a to 24c, which constitute the capacitor pattern, the coil pattern and the like, is formed on the resultant insulator ceramic green sheet or dielectric ceramic green sheet by the wiring pattern forming method of the first embodiment using the photoreactive resin composition of the present invention. The via holes 25 are formed in the insulator ceramic green sheet and dielectric ceramic green sheet according to demand.

The ceramic green sheets each having the internal layer pattern 24 and the via holes 25 formed therein are laminated, pressure-bonded, and then burned at a predetermined temperature.

Furthermore, the surface layer pattern 29 is formed on the outer surface of the obtained burned product by the pattern forming method of the first embodiment using the photoreactive resin composition of the present invention, and then burned at predetermined temperature.

Figure 3:
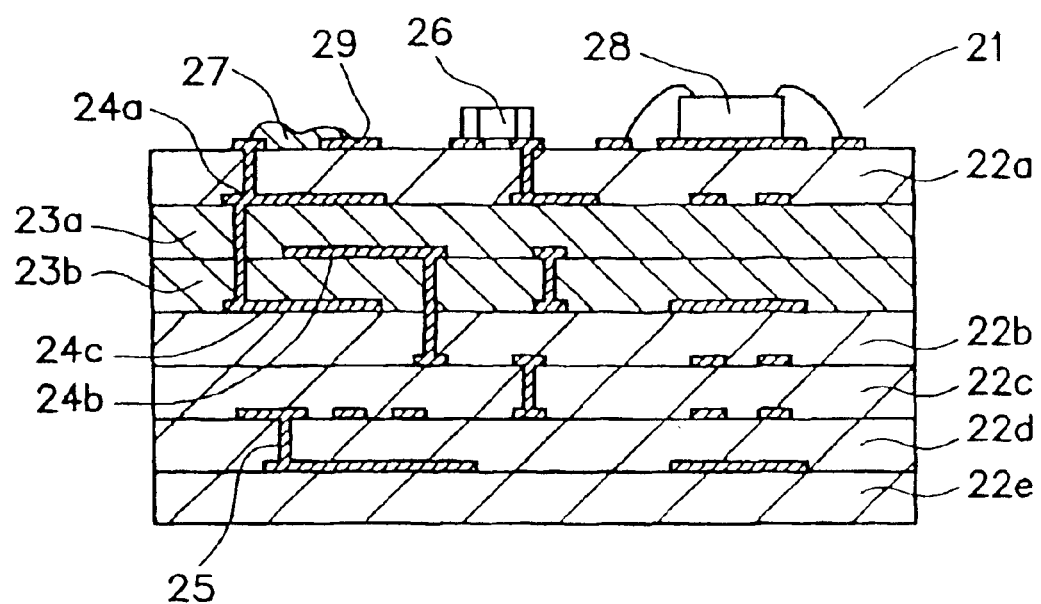
FIG. 3 is a schematic sectional view showing a ceramic multilayer substrate according to the present invention.

Furthermore, the chip part 26, the thick film resistor 27 and the semiconductor IC 28 are printed on the burned product to form the ceramic multilayer substrate 21 shown in FIG. 3.

EXAMPLES

The present invention is described below with reference to examples.

(1) Preparation of Ceramic Green Sheet 37.3 g of borosilicate glass powder, 24.9 g of alumina powder, 6.2 g of copolymer (weight average molecular weight=50,000) of methacrylic acid and methyl methacrylate at a copolymerization ratio by weight of 25/75, 3.1 g of ethanol and 0.5 g of dipropylene glycol monomethyl ether were mixed to form slurry. The thus-obtained slurry was formed in a sheet by the doctor blade method, and then dried at 100° C. for 1 hour to prepare a ceramic green sheet of 30 µm in thickness.

(2) Preparation of Photoreactive Resin Composition

In the examples, the following materials were used for preparing photoreactive resin compositions.

(a) Inorganic Powder Containing Polyvalent Metal Powder and/or Polyvalent Metal Oxide Powder $A_1$. Polyvalent Metal Powder Copper powder a: Prepared by allowing a copper powder to stand at 200° C. and 70% RH to oxidize the surface thereof. The copper powder had an oxygen content of 0.5% by weight and an average particle diameter of 3 µm and comprised spherical particles.

Copper powder b: Prepared by spraying a CuO powder having a particle diameter of 0.1 µm or less on a copper powder to coat the powder with CuO. The copper powder had an oxygen content of 0.5% by weight and an average particle diameter of 3 µm and comprised spherical particles.

Copper powder c: Without being oxidized. The copper powder had an oxygen content of 0.2% by weight and an average particle diameter of 3 µm and comprised spherical particles.

Copper powder d: Prepared by allowing a copper powder to stand at 200° C. and 70% RH in an oxygen-containing atmosphere to oxidize the surface thereof. The copper powder had an oxygen content of 0.3% by weight and an average particle diameter of 3 µm and comprised spherical particles.

Copper powder e: Prepared by surface oxidization by the same method as copper powder d. The copper powder had an oxygen content of 1.0% by weight and an average particle diameter of 3 µm and comprised spherical particles.

Copper powder f: Prepared by surface oxidization by the same method as copper powder d. The copper powder had an oxygen content of 1.5% by weight and an average particle diameter of 3 µm and comprised spherical particles.

$A_2$. Polyvalent Metal Oxide Powder

Glass powder a: $SiO_2$—$Bi_2O_3$—$B_2O_3$ glass having an average particle diameter of 3 µm and comprised spherical particles. Glass powder b: $SiO_2$—$PbO$—$B_2O_3$ glass having an average particle diameter of 3 µm and comprised spherical particles.

(b) Alkali-Soluble First Polymer Having an Ethylenically Unsaturated Double Bond Methacrylic acid and methyl methacrylate were coplymerized, followed by addition reaction with epoxy cylcohexyl methacrylate in an amount of 0.2 times by mole as large as methacrylic acid to obtain the alkali-soluble first polymer having an ethylenically unsaturated double bond (Mw=20000, acid value=118).

(c) Monomer Having an Ethylenically Unsaturated Double Bond Ethoxylated Trimethylolpropane Triacrylate (d) Photoreaction Initiator Initiator a: 2-methyl-1-[4-(methylthio)phenyl]-2-morpholinopropane-1-one Initiator b: 2,4-diethylthioxanthone (e) Organic Solvent Organic solvent a: Dipropylene glycol monomethyl ether Organic solvent b: Pentamethylene glycol (f) Second Polymer Having a Pyrrolidone Ring in a Side Chain PVP12: Polyvinylpyrrolidone (F characteristic value=12)
PVP15: Polyvinylpyrrolidone (F characteristic value=15)
PVP30: Polyvinylpyrrolidone (F characteristic value=30)
PVP90: Polyvinylpyrrolidone (F characteristic value=90)
P(VP/AA): Copolymer of 50% vinylpyrrolidone and 50% acrylic acid (Mw=100000)
P(VP/VA): Copolymer of 50% vinylpyrrolidone and 50% vinyl acetate (Mw=100000)

(g) Polyhydric Alcohol

Polyhydric alcohol a: Glucitol (having six hydroxyl groups)

Polyhydric alcohol b: Glycerin (having three hydroxyl groups)

Polyhydric alcohol a: Erythritol (having four hydroxyl groups)

(h) Ultraviolet Absorber

Ultraviolet absorber: Azo dye (i) Others

Dispersant: Polyvalent carboxylic acid-type dispersant having a solid content of 50%

Stabilizer: 1,2,3-benzotriazole

The above materials were weighed and mixed to obtain the compositions shown in Tables 1 to 4. Each of the thus-obtained compositions was kneaded with a three-roll mill to prepare Samples 1 to 32 of photoreactive resin compositions.

(3) Evaluation of the Number of Days Before Gelation

Each of Samples 1 to 32 of the photoreactive resin compositions was coated on an alumina substrate by a spin coater, and dried at 100° C. for 1 hour to evaluate whether or not a uniform film was formed. Next, each of the obtained films was developed with a sodium carbonate aqueous solution to evaluate whether or not the film was removed.

The above-described evaluation was performed for the photoreactive resin composition of each of the samples at an interval of 10 days during storage under dehumidification conditions at room temperature to determine, as the number of days before gelation, the date when a uniform film could not be formed or could not be removed. The samples were compared with each other based on the number of days before gelation. The results are shown in Table 1 to 4.

TABLE 1

| | | | \multicolumn{10}{c}{Sample No.} |
|---|---|---|---|---|---|---|---|---|---|---|---|---|
| | | | 1 | 2 | 3 | 4 | 5 | 6 | 7 | 8 | 9 | 10 |
| $A_1$ | Copper powder a | (g) | 110 | 110 | 110 | 110 | 110 | 110 | 110 | 110 | 110 | 110 |
| $A_2$ | Glass powder b | (g) | 3.4 | 3.4 | 3.4 | 3.4 | 3.4 | 3.4 | 3.4 | 3.4 | 3.4 | 3.4 |
| B | Polymer | (g) | 6.0 | 6.0 | 6.0 | 6.0 | 6.0 | 6.0 | 6.0 | 6.0 | 6.0 | 6.0 |
| C | Monomer | (g) | 6.0 | 6.0 | 6.0 | 6.0 | 6.0 | 6.0 | 6.0 | 6.0 | 6.0 | 6.0 |
| D | Initiator a | (g) | 1.0 | 1.0 | 1.0 | 1.0 | 1.0 | 1.0 | 1.0 | 1.0 | 1.0 | 1.0 |
| | Initiator b | (g) | 0.1 | 0.1 | 0.1 | 0.1 | 0.1 | 0.1 | 0.1 | 0.1 | 0.1 | 0.1 |
| E | Organic solvent a | (g) | 15.0 | 15.0 | 15.0 | 15.0 | 15.0 | 15.0 | 15.0 | 15.0 | 15.0 | 15.0 |
| | Organic solvent b | (g) | 15.0 | 15.0 | 15.0 | 15.0 | 15.0 | 15.0 | 15.0 | 15.0 | 15.0 | 15.0 |
| F | PVP12 | (g) | — | — | 1.0 | — | — | — | — | — | — | — |
| | PVP15 | (g) | — | — | — | 1.0 | — | — | — | — | — | — |
| | PVP30 | (g) | 1.0 | — | — | — | — | — | 0.05 | 0.11 | 4.4 | 6.6 |
| | PVP90 | (g) | — | — | — | — | 1.0 | — | — | — | — | — |
| | P (VP/AA) | (g) | — | 1.0 | — | — | — | — | — | — | — | — |
| | P (VP/VA) | (g) | — | — | — | — | — | 1.0 | — | — | — | — |
| G | Polyhydric alcohol a | (g) | 1.0 | 1.0 | 1.0 | 1.0 | 1.0 | 1.0 | 1.0 | 1.0 | 1.0 | 1.0 |
| H | Ultraviolet absorber | (g) | 0.1 | 0.1 | 0.1 | 0.1 | 0.1 | 0.1 | 0.1 | 0.1 | 0.1 | 0.1 |
| | Dispersant | (g) | 1.0 | 1.0 | 1.0 | 1.0 | 1.0 | 1.0 | 1.0 | 1.0 | 1.0 | 1.0 |
| | Number of days before gelation | (days) | ≧90 | 20 | 30 | ≧90 | 20 | 60 | 60 | ≧90 | ≧90 | 60 |

TABLE 2

| | | | \multicolumn{9}{c}{Sample No.} |
|---|---|---|---|---|---|---|---|---|---|---|---|
| | | | 11 | 12 | 13 | 14 | 15 | 16 | 17 | 18 | 19 |
| $A_1$ | Copper powder a | (g) | 110 | 110 | 110 | 110 | 110 | 110 | 110 | 110 | 110 |
| $A_2$ | Glass powder b | (g) | 3.4 | 3.4 | 3.4 | 3.4 | 3.4 | 3.4 | 3.4 | 3.4 | 3.4 |
| B | Polymer | (g) | 6.0 | 6.0 | 6.0 | 6.0 | 6.0 | 6.0 | 6.0 | 6.0 | 6.0 |
| C | Monomer | (g) | 6.0 | 6.0 | 6.0 | 6.0 | 6.0 | 6.0 | 6.0 | 6.0 | 6.0 |
| D | Initiator a | (g) | 1.0 | 1.0 | 1.0 | 1.0 | 1.0 | 1.0 | 1.0 | 1.0 | 1.0 |
| | Initiator b | (g) | 0.1 | 0.1 | 0.1 | 0.1 | 0.1 | 0.1 | 0.1 | 0.1 | 0.1 |
| E | Organic solvent a | (g) | 15.0 | 15.0 | 15.0 | 15.0 | 15.0 | 4.0 | 4.0 | 15.0 | 15.0 |
| | Organic solvent b | (g) | 15.0 | 15.0 | 15.0 | 15.0 | 0.0 | 4.0 | 6.0 | 35.0 | 45.0 |
| F | PVP30 | (g) | — | 1.0 | 1.0 | 1.0 | 1.0 | 1.0 | 1.0 | 1.0 | 1.0 |

TABLE 2-continued

| | | | Sample No. | | | | | | | | |
|---|---|---|---|---|---|---|---|---|---|---|---|
| | | | 11 | 12 | 13 | 14 | 15 | 16 | 17 | 18 | 19 |
| G | Polyhydric alcohol a | (g) | 1.0 | — | — | — | 1.0 | 1.0 | 1.0 | 1.0 | 1.0 |
| | Polyhydric alcohol b | (g) | — | — | 1.0 | — | — | — | — | — | — |
| | Polyhydric alcohol c | (g) | — | — | — | 1.0 | — | — | — | — | — |
| H | Ultraviolet absorber | (g) | 0.1 | 0.1 | 0.1 | 0.1 | 0.1 | 0.1 | 0.1 | 0.1 | 0.1 |
| | Dispersant | (g) | 1.0 | 1.0 | 1.0 | 1.0 | 1.0 | 1.0 | 1.0 | 1.0 | 1.0 |
| | Stabilizer | (g) | 1.0 | 0.0 | 0.0 | 0.0 | 0.0 | 0.0 | 0.0 | 0.0 | 0.0 |
| | Number of days before gelation | (days) | 10 | 40 | 40 | ≧90 | 40 | 60 | ≧90 | ≧90 | ≧90 |

TABLE 3

| | | | Sample No. | | | | |
|---|---|---|---|---|---|---|---|
| | | | 20 | 21 | 22 | 23 | 24 |
| $A_1$ | Copper powder b | (g) | 110 | — | — | — | — |
| | Copper powder c | (g) | — | 110 | — | — | — |
| | Copper powder d | (g) | — | — | 110 | — | — |
| | Copper powder e | (g) | — | — | — | 110 | — |
| | Copper powder f | (g) | — | — | — | — | 110 |
| $A_2$ | Glass powder b | (g) | 3.4 | 3.4 | 3.4 | 3.4 | 3.4 |
| B | Polymer | (g) | 6.0 | 6.0 | 6.0 | 6.0 | 6.0 |
| C | Monomer | (g) | 6.0 | 6.0 | 6.0 | 6.0 | 6.0 |
| D | Initiator a | (g) | 1.0 | 1.0 | 1.0 | 1.0 | 1.0 |
| | Initiator b | (g) | 0.1 | 0.1 | 0.1 | 0.1 | 0.1 |
| E | Organic solvent a | (g) | 15.0 | 15.0 | 15.0 | 15.0 | 15.0 |
| | Organic solvent b | (g) | 15.0 | 15.0 | 15.0 | 15.0 | 15.0 |
| F | PVP30 | (g) | 1.0 | 1.0 | 1.0 | 1.0 | 1.0 |
| G | Polyhydric alcohol a | (g) | 1.0 | 1.0 | 1.0 | 1.0 | 1.0 |
| H | Ultraviolet absorber | (g) | 0.1 | 0.1 | 0.1 | 0.1 | 0.1 |
| | Dispersant | (g) | 1.0 | 1.0 | 1.0 | 1.0 | 1.0 |
| | Number of days before gelation | (days) | 30 | 20 | 60 | ≧90 | 60 |

Tables 1 to 4 indicate that the photoreactive resin composition of Sample 1 containing PVP30 can be used for 90 days or more, while the photoreactive resin compositions of Samples 11 and 26 not containing PVP30 are unusable after the passage of 10 days.

It is also found that the photoreactive resin compositions of Samples 2 and 6 containing P(VP/AA) and P(VP/VA) instead of PVP30 are unusable after the passage of 20 days and 60 days, respectively.

Furthermore, the photoreactive resin compositions of Samples 1 and 4 containing polyvinylpyrrolidone having an F characteristic value of 15 to 60 can be used for 90 days or more, while the photoreactive resin compositions of Samples 3 and 5 containing polyvinylpyrrolidone having an F characteristic value of less than 15 or over 60 are unusable after the passage of 30 days and 20 days, respectively.

Furthermore, the photoreactive resin compositions of Samples 1, 8 and 9 containing PVP30 in an amount of 0.1 part by weight to 5 parts by weight based on 100 parts by weight of copper powder can be used for 90 days or more, while the photoreactive resin compositions of Samples 7 and 10 containing PVP30 in an amount of less than 0.1 part by weight or over 5 parts by weight are unusable after the passage of 60 days.

TABLE 4

| | | | Sample No. | | | | | | | |
|---|---|---|---|---|---|---|---|---|---|---|
| | | | 25 | 26 | 27 | 28 | 29 | 30 | 31 | 32 |
| $A_2$ | Glass powder a | (g) | 300 | 300 | 300 | 300 | 300 | 300 | 300 | 300 |
| B | Polymer | (g) | 60.0 | 60.0 | 60.0 | 60.0 | 60.0 | 60.0 | 60.0 | 60.0 |
| C | Monomer | (g) | 60.0 | 60.0 | 60.0 | 60.0 | 60.0 | 60.0 | 60.0 | 60.0 |
| D | Initiator a | (g) | 10.0 | 10.0 | 10.0 | 10.0 | 10.0 | 10.0 | 10.0 | 10.0 |
| | Initiator b | (g) | 1.0 | 1.0 | 1.0 | 1.0 | 1.0 | 1.0 | 1.0 | 1.0 |
| E | Organic solvent a | (g) | 150 | 150 | 150 | 150 | 150 | 150 | 150 | 150 |
| | Organic solvent b | (g) | 150 | 150 | 150 | 150 | 150 | 150 | 150 | 150 |
| F | PVP30 | (g) | 10.0 | — | 0.02 | 0.03 | 0.3 | 3.0 | 30.0 | 40.0 |
| G | Polyhydric alcohol a | (g) | 10.0 | 10.0 | 10.0 | 10.0 | 10.0 | 10.0 | 10.0 | 10.0 |
| H | Ultraviolet absorber | (g) | 1.0 | 1.0 | 1.0 | 1.0 | 1.0 | 1.0 | 1.0 | 1.0 |
| | Dispersant | (g) | 10.0 | 10.0 | 10.0 | 10.0 | 10.0 | 10.0 | 10.0 | 10.0 |
| | Stabilizer | (g) | — | 10.0 | — | — | — | — | — | — |
| | Number of days before gelation | (days) | ≧90 | 10 | 60 | ≧90 | ≧90 | ≧90 | ≧90 | 60 |

Furthermore, the photoreactive resin compositions of Samples 1 and 14 containing a polyhydric alcohol having four or more hydroxyl groups per molecule can be used for 90 days or more, while the photoreactive resin composition of Sample 12 not containing a polyhydric alcohol and the photoreactive resin composition of Sample 13 containing a polyhydric alcohol having only three hydroxyl groups per molecule are unusable after the passage of 40 days.

The photoreactive resin composition of Sample 1 containing organic solvent B, which is a diol compound, can be used for 90 days or more, while the photoreactive resin composition of Sample 15 not containing solvent B is unusable after the passage of 40 days.

The photoreactive resin compositions of Samples 1 and 17 to 19 containing an organic solvent in an amount of 10 times by weight to 50 times by weight larger than the PVP30 can be used for 90 days or more, while the photoreactive resin composition of Sample 16 containing an organic solvent in an amount of less than 10 times by weight that of the PVP30 is unusable after the passage of 60 days.

The photoreactive resin composition of Sample 20 containing copper powder B coated with CuO by spraying a CuO powder is unusable after the passage of 20 days, while the photoreactive resin composition of Sample 21 containing copper powder A not coated is unusable after the passage of 10 days. As can be seen from the photoreactive resin composition of Sample 1, by using copper powder A with the surface oxidized by heating in the air, the photoreactive resin composition can be used for 90 days or more.

The photoreactive resin compositions of Samples 1 and 23 containing a copper powder having an oxygen content of 0.4% by weight to 1.2 by weight can be used for 90 days or more, while the photoreactive resin compositions of Samples 22 and 24 containing a copper powder having an oxygen content of less than 0.4% by weight or over 1.2% by weight are unusable after the passage of 60 days.

The photoreactive resin composition of Sample 25 containing PVP30 can be used for 90 days or more, while the photoreactive resin composition of Sample 26 not containing PVP30 is unusable after the passage of 10 days.

The photoreactive resin compositions of Samples 25 and 28 to 31 containing PVP30 in an amount of 0.01 part by weight to 1 part by weight based on 100 parts by weight of glass powder can be used for 90 days or more, while the photoreactive resin compositions of Samples 27 and 32 containing PVP30 in an amount of less than 0.01 part by weight or over 1 part by weight are unusable after the passage of 60 days.

(4) Formation of Copper Pattern

Each of the photoreactive resin compositions of Samples 1, 4, 8, 9, 14, 17 to 19 and 23 which can be used for 90 days or more was coated on a polyethylene terephthalate (PET) film by a spin coater, and then dried at 100° C. for 1 hour to form a film of 20 $\mu$m in thickness. The photoreactive resin composition of Sample 19 containing the organic solvent in an amount of over 50 times by weight as large as PVP30 could not be uniformly coated because of its excessively low viscosity.

Next, each of the thus-obtained films was exposed. In exposure, each film was irradiated with active rays from a high-pressure mercury lamp with an exposure of 250 mJ/cm$^2$ through a mask having a pattern formed with line/space (L/S)=20/20 ($\mu$m). Then, development with a sodium carbonate aqueous solution was performed to form a pattern with L/S=20/20 on the PET film.

The pattern formation surface of the PET film was superposed on the ceramic green sheet prepared by the method above described in (1), and heat-pressed for 1 minute at 10 MPa and 60° C. Then, the PET film was separated from the ceramic green sheet to transfer the pattern onto the ceramic green sheet.

Furthermore, five ceramic green sheets each having a pattern formed by the same method as described above were formed. These ceramic green sheets were laminated, and then heat-pressed at 200 MPa and 60° C. for 1 hour. After degreasing, the resultant laminate was burned at 900° C. in an N$_2$ atmosphere to obtain a multilayer alumina substrate having patterns with L/S=10/30 ($\mu$m) formed in the surface layer and the internal layers.

The photoreactive resin composition of the present invention contains a predetermined amount of polymer having a pyrrolidone ring in a side chain, and thus the composition is not gelled even when the alkali-soluble polymer has an ethylenically unsaturated double bond. Therefore, the photoreactive resin composition permits the formation of a fine thick-film pattern while stably maintaining sensitivity at a high level.

Furthermore, the method of manufacturing a circuit board and a ceramic multilayer substrate of the present invention comprises coating the photoreactive resin composition of the present invention on a substrate (or a supporting member) by screen printing, spin coating or the like, drying the coated film, exposing and developing the film by photolithography to form a predetermined pattern (unburned), and then baking the pattern. Therefore, a high-resolution pattern can be formed, and a fine and uniform thick-film wiring pattern and via holes, which cannot be obtained by a conventional screen printing method, can be formed. Consequently, a small size circuit board or circuit element having excellent radio-frequency characteristics can be manufactured. Thus, a radio-frequency chip electronic part and a ceramic multilayer substrate capable of sufficiently complying with a higher density and higher-speed signals can be manufactured.

Various changes and modifications can be made in the process and products of this invention without departing from the spirit and scope thereof. The embodiments set forth herein were for the purpose of illustration only and were not intended to limit the invention.

What is claimed is:

1. A photoreactive resin composition comprising:
    (a) an inorganic powder comprising a polyvalent metal powder comprising a copper powder coated with a copper oxide;
    (b) an alkali-soluble polymer containing an ethylenically unsaturated double bond;
    (c) an ethylenically unsaturated monomer;
    (d) a photoreaction initiator;
    (e) an organic solvent; and
    (f) a second polymer having a pyrrolidone ring in a side chain.

2. The photoreactive resin composition according to claim 1 wherein the oxygen content of the copper powder is 0.4% by weight to 1.2% by weight.

3. A photoreactive resin composition according to claim 1, wherein the second polymer is a copolymer of vinylpyrrolidone and a monomer having an ethylenically unsaturated double bond.

4. The photoreactive resin composition according to claim 1, wherein the monomer having an ethylenically unsaturated double bond has no acid functional group.

5. The photoreactive resin composition according to claim 1, wherein the second polymer is polyvinylpyrrolidone.

6. The photoreactive resin composition according to claim 1, wherein the second polymer has a Fikentscher viscosity characteristic value of 15 to 60.

7. The photoreactive resin composition according to claim 1, wherein the content of the second polymer is 0.1 part by weight to 5 parts by weight based on 100 parts by weight of the polyvalent metal powder contained in the inorganic powder.

8. The photoreactive resin composition according to claim 1, wherein the organic solvent comprises a diol.

9. The photoreactive resin composition according to claim 1, wherein the content of the organic solvent is 10 times by weight to 50 times by weight the weight of the second polymer.

10. A photoreactive resin composition comprising:
    (a) an inorganic powder comprising at least one of a polyvalent metal powder and a polyvalent metal oxide powder;
    (b) an alkali-soluble polymer containing an ethylenically unsaturated double bond;
    (c) an ethylenically unsaturated monomer;
    (d) a photoreaction initiator;
    (e) an organic solvent;
    (f) a second polymer having a pyrrolidone ring in a side chain;
    wherein the content of the second polymer is 0.01 part by weight to 1 part by weight based on 100 parts by weight of the polyvalent metal oxide powder contained in the inorganic powder.

11. A photoreactive resin composition comprising:
    (a) an inorganic powder comprising at least one of a polyvalent metal powder and a polyvalent metal oxide powder;
    (b) an alkali-soluble polymer containing an ethylenically unsaturated double bond;
    (c) an ethylenically unsaturated monomer;
    (d) a photoreaction initiator;
    (e) an organic solvent;
    (f) a second polymer having a pyrrolidone ring in a side chain; and
    (g) a polyhydric alcohol having four or more hydroxyl groups per molecule.

12. A photoreactive resin composition comprising:
    (a) an inorganic powder comprising at least one of a polyvalent metal powder having an average particle diameter $D_{50}$ of 1 $\mu$m to 5 $\mu$m and a specific surface area of 0.1 to 2 $m^2/g$ and a polyvalent metal oxide powder having an average particle diameter $D_{50}$ of 1 $\mu$m to 5 $\mu$m and a specific surface area of 1 to 10 $m^2/g$;
    (b) a alkali-soluble (meth)acrylic polymer having a weight average molecular weight of 50,000 or less and an acid value of 50 to 150;
    (c) a photopolymerizable ethylenically unsaturated monomer;
    (d) a photoreaction initiator;
    (e) an organic solvent having a boiling point of 170 to 300° C.; and
    (f) a second polymer having a pyrrolidone ring in a side chain and having a Fikentscher viscosity characteristic value of 15 to 60;
    wherein the content of the organic solvent is 10 to 50 times by weight the weight of the second polymer, the content of the second polymer is 0.1 part by weight to 5 parts by weight based on 100 parts by weight of the polyvalent metal powder contained in the inorganic powder, and wherein the polyvalent metal powder comprises a copper powder coated with a copper oxide and having an oxygen content of the copper powder of 0.4% by weight to 1.2% by weight.

13. The photoreactive resin composition according to claim 12, wherein the second polymer is polyvinylpyrrolidone.

14. The photoreactive resin composition according to claim 13, wherein the organic solvent comprises a diol and the photoreactive resin composition further comprises a polyhydric alcohol having four or more hydroxyl groups per molecule.

* * * * *